(12) United States Patent
Kanoun

(10) Patent No.: US 11,381,205 B2
(45) Date of Patent: Jul. 5, 2022

(54) POTENTIOSTAT CIRCUIT

(71) Applicant: SEMICONDUCTOR COMPONENTS INDUSTRIES, LLC, Phoenix, AZ (US)

(72) Inventor: Moez Kanoun, Waterloo (CA)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 455 days.

(21) Appl. No.: 16/670,131

(22) Filed: Oct. 31, 2019

(65) Prior Publication Data

US 2021/0091728 A1 Mar. 25, 2021

Related U.S. Application Data

(60) Provisional application No. 62/905,768, filed on Sep. 25, 2019.

(51) Int. Cl.
*H03F 3/04* (2006.01)
*G01N 27/49* (2006.01)
*G01N 27/416* (2006.01)

(52) U.S. Cl.
CPC .............. *H03F 3/04* (2013.01); *G01N 27/49* (2013.01); *H03F 2200/129* (2013.01); *H03F 2200/375* (2013.01)

(58) Field of Classification Search
CPC ................. H03F 3/04; H03F 2200/129; H03F 2200/375; H03F 1/14; H03F 2200/447; H03F 1/301; H03F 3/3023; H03F 3/393; H03F 3/45475; H03F 3/347; G01N 27/49; G05F 1/567
USPC .......................... 204/406; 330/288; 324/429
See application file for complete search history.

(56) References Cited

U.S. PATENT DOCUMENTS

2010/0066378 A1 3/2010 Ahmadi et al.
2021/0262977 A1* 8/2021 Kanoun ............. G01N 27/4175

OTHER PUBLICATIONS

Mohammad Mahdi Ahmadi, et al., "Current-Mirror-Based Potentiostats for Three-Electrode Amperometric Electrochemical Sensors," IEEE Transactions on Circuits and Systems—I: regular papers, vol. 56, No. 7, Jul. 2009.

* cited by examiner

*Primary Examiner* — Hieu P Nguyen
(74) *Attorney, Agent, or Firm* — Brake Hughes Bellermann LLP

(57) ABSTRACT

A potentiostat circuit for controlling a work electrode voltage and for measuring a work electrode current is disclosed. The disclosed potentiostat circuit implementations have a topology and include elements to provide a plurality of benefits. The plurality of benefits includes an enlarged range of controllable work electrode voltages and bidirectional work electrode current measurements, high immunity from temperatures variations and process mismatch. The disclosed potentiostat circuit implementations can be used in applications requiring accuracy, low power consumption, and small size. The applications can include portable and/or multichannel electrochemical applications.

20 Claims, 7 Drawing Sheets

POTENTIOSTAT CIRCUIT

CROSS-REFERENCE TO RELATED APPLICATIONS

This application claims the benefit of U.S. Provisional Patent Application No. 62/905,768, filed on Sep. 25, 2019, the entire contents of which is incorporated herein by reference.

FIELD OF THE DISCLOSURE

The present disclosure relates measurement and control devices and more specifically, to a potentiostat circuit for fixing a voltage across an electrochemical cell (i.e., cell) and for measuring a current through the cell.

BACKGROUND

In electrochemistry, characteristics, mechanisms, and phenomena may be studied using an electro-chemical measurement system that includes an electrochemical cell (i.e., cell). The cell includes electrodes submerged in a liquid (e.g., a solution). A first electrode (i.e., work electrode) may determine an electrochemical reaction under measurement. Accordingly, the work electrode (WE) may be further distinguished by a chemical species under measurement (e.g., peroxide, oxygen). A second electrode (i.e., reference electrode) is an electrode that completes a circuit with the WE. For example, a source voltage applied between the WE and the reference electrode (RE) can produce a current through the solution. The cell may also include a third electrode. In some implementations, the third electrode can be a counter electrode (CE) to fix accurately the voltage on the reference electrode RE. In some two electrode configurations, the system can include a WE and a RE. In some three electrode configurations, the system can include a WE, a RE, and a CE.

The electro-chemical measurement system may also include a potentiostat. The potentiostat can be coupled to the electrodes of the cell and used to fix (i.e., maintain) the applied voltage difference (e.g., between the WE and the RE). Additionally, the potentiostat can measure the current flowing into or out of the WE, which can be correlated to the results of the electrochemical experiment.

SUMMARY

In at least one aspect, the present disclosure generally describes a potentiostat circuit (i.e., potentiostat). The potentiostat includes a feedback amplifier that is coupled to a work electrode (WE) and set a voltage (vdac). The feedback amplifier is configured to set a voltage on the work electrode $v_{WE}$ equal to vdac and to sense the work electrode current ($i_{WE}$) in one of two directions. The potentiostat further includes a bias current source that is coupled between a voltage source (vdd) and the feedback amplifier. The bias current source is configured to output a bias current ($i_{BIAS}$). The bias current source has a voltage (i.e., a voltage drop, voltage across) that (at least) partially determines an upper limit (i.e., upper voltage limit) of a range of possible work-electrode voltages. The potentiostat also includes an output current mirror that is coupled to the feedback amplifier and to the bias current source. The output current mirror is configured to mirror (i.e., duplicate) the difference between the bias current and the work-electrode current plus an offset current to an output node. The output current mirror has a voltage (i.e. a voltage drop, voltage across) that does not (at least) partially determine the upper limit of the range of possible work-electrode voltages. The output current mirror outputs an output current that can be digitized using a current-to-digital converter.

In some implementations the method further includes creating a copy of the bias current source using a current copier (i.e., duplicating) circuit (i.e., a bias-current copier, bias-current copier circuit) and coupling the copy of the bias current source to the output node to cancel the bias current source from the output current at the output node.

In another aspect, the present disclosure generally describes an electro-chemical measurement system (i.e., system). The system includes an electrochemical cell that includes a work electrode. The system further includes a bidirectional potentiostat that is configured to maintain a work-electrode voltage on the work electrode and that is further configured to measure a work-electrode current at the work electrode, which can flow into the work electrode or out of the work electrode (i.e., is bidirectional). In some implementations, the bidirectional potentiostat includes creating a copy of the bias current source using a current copier (i.e., duplicating) circuit (i.e., a current copier) and a copy of the offset current. The copied bias current source and the copied offset current are coupled to the output node to cancel the bias current source and the offset current from the output current at the output node.

In some implementations, the output-current mirror and/or the current copier is in a cascode configuration and includes a chopper and an amplifier to reduce the effect of the mismatch between the transistors forming the output-current mirror and to improve the output impedance of the output-current mirror. In some implementations, the output-current mirror and the bias current copier and the offset current source are in a cascode configuration and include a chopper and an amplifier to improve the matching performances and to improve the output impedance. In some implementations, the offset current source is canceled from the output current mirror using a current copier. In some implementations, the offset current is matched to a reference current source (i.e., used in the current-to-digital converter) by the use of a cascode current copier, a chopper and an amplifier to boost the output impedance. In some implementations, the use of the chopper circuit can permit the use of the relatively small devices, while maintaining favorable matching performance, which can be result in a relatively small-sized (e.g., die area) potentiostat. Accordingly, portable and/or multichannel implementations of the system may be possible. In some implementations, the cascode and the amplifier can be used to boost the output impedance of the current mirror and hence improve the mirroring. In some implementations, the chopper can be used to improve the matching performances without using relatively large devices.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

It may be desirable for a potentiostat to accurately measure a work-electrode current for a range of applied work-electrode voltages despite possible variations in a temperature of the potentiostat or process variations (i.e., due to manufacturing), which can lead to mismatched devices in the potentiostat.

The present disclosure embraces a potentiostat circuit (i.e., potentiostat) coupled to an electrochemical cell including two or more electrodes (e.g., a work electrode, a reference electrode, a counter-electrode). The potentiostat can be configured to (i) maintain (i.e., fix) a voltage applied to a work-electrode voltage (i.e., WE voltage) and (ii) accurately measure work-electrode current (i.e., WE current), which can flow in one of two directions (i.e., bidirectional). The disclosed approach may utilize a current mirror to copy the WE current outside the path of the work electrode in order to increase the voltage range on the work electrode. The disclosed potentiostat may further include a cascode device coupled to the current mirror in a folded-cascode topology to extend a WE voltage range and allow for measurement of the WE current in a source direction or a sink direction (i.e., allow for a bidirectional current measurement). In some implementations, the disclosed potentiostat further includes a current chopper (i.e., chopper) to increase measurement accuracy (i.e., of the WE current) and reduce a variation (i.e., drift) caused by temperature fluctuations. The disclosed potentiostat is relatively power efficient, making it suitable for low-power and/or portable applications. The disclosed potentiostat can occupy a relatively small die area, making it suitable for portable and/or multichannel applications.

Many of the implementations described herein are discussed in terms of a particular conductivity type transistor (e.g., N-type transistor). In some implementations, the conductivity types can be reversed. In some implementations, the circuits can be configured using different types of transistors such as a bipolar transistor, and/or so forth.

Figure 1:
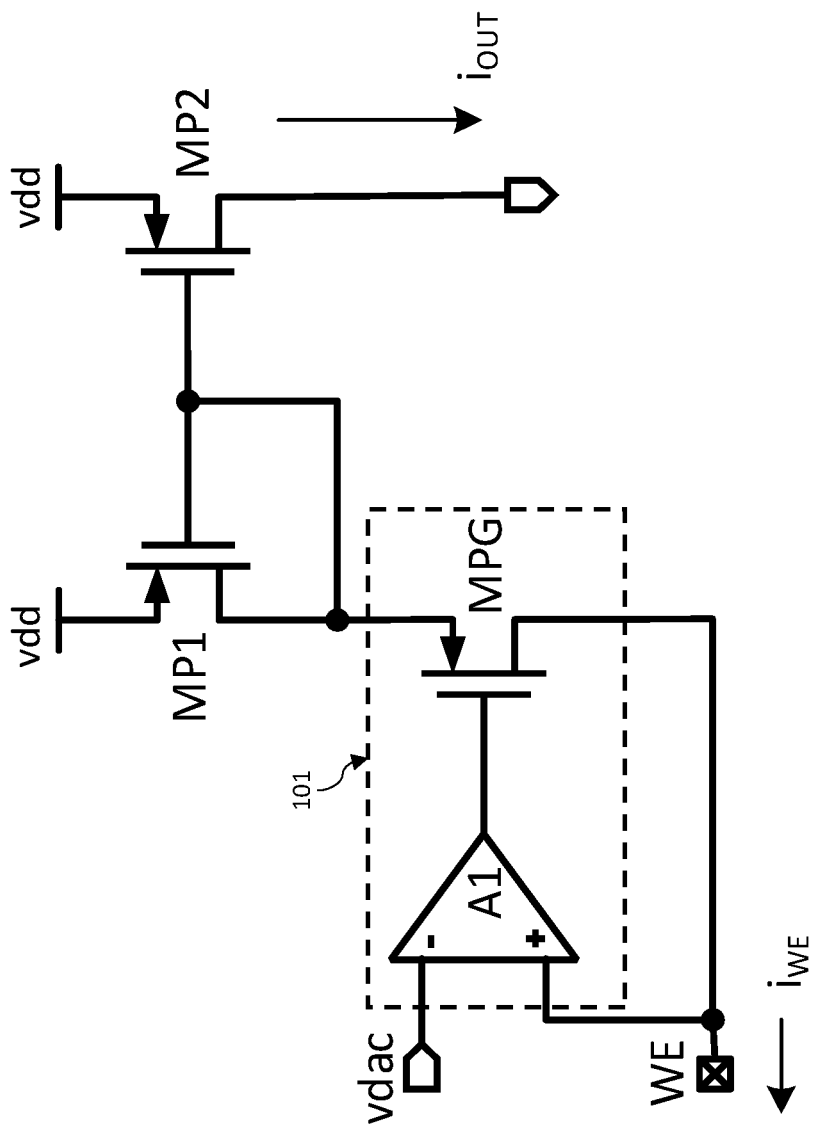
FIG. 1 schematically depicts a current mirror potentiostat.

FIG. 1 illustrates a potentiostat that includes a current mirror. The current-mirror potentiostat includes a first amplifier (A1) that is coupled to a transistor (MPG). The first amplifier (A1) and the transistor (MPG) may be considered as a feedback amplifier 101. Feedback amplifier 101 is used to set a voltage (i.e., vdac) on the WE. The current flowing from the WE can be copied using a current mirror including matched transistors (MP1, MP2). The current mirror is configured to generate an output current ($i_{OUT}$) that mirrors (e.g. is a copy of) the work-electrode current ($i_{WE}$) to the output node. As shown, MPG, MP1, and MP2 may be a p-channel metal oxide semiconductor field effect transistor (MOSFET).

It may be desirable to accommodate a large range of WE voltages (e.g., a large WE-voltage range with an upper voltage limit as close to a supply rail as possible). The current-mirror potentiostat may have a limited WE-voltage range, however, because the upper WE voltage (i.e., V(WE) max) limited to:

$$V(WE)_{max} = vdd - V_{SG_{MP1}} - V_{SD_{MPG}} \quad (1)$$

The voltage, vdd, is the supply voltage, the voltage $V_{SD_{MPG}}$ is the source-to-drain voltage across MPG, and the voltage $V_{SG_{MP1}}$ is the source-gate voltage of the diode-connected transistor, MP1, which depends on the current passing through MP1 and on its threshold that depends on the technology node. In order to minimize a mismatch between the work-electrode current ($i_{WE}$) and the copied current ($i_{OUT}$), the transistors MP1 and MP2 should have a large area and must be biased in a strong-inversion condition. In the strong-inversion condition, $v_{SG_{MP1}}$ can be at least 0.2 volts (V) above a threshold voltage ($v_{th}$). A transistor having a threshold voltage of 0.7V, implies that 0.9V of a WE-voltage range may be consumed by establishing the strong-inversion condition. In other words, maximum applied voltage (vdac) to which WE voltage can be set is limited by this strong-inversion condition. This limitation can be significant when vdd is low (e.g., 3 volts), such as in a low-power application. Moreover, to measure currents in the range of few hundreds of picoamps (pA) to a hundred of nanoamps (nA), the transistors must have a very large channel (L), which makes the occupied area (i.e., size) of the current mirror transistors (MP1, MP2) quite large.

Figure 2:
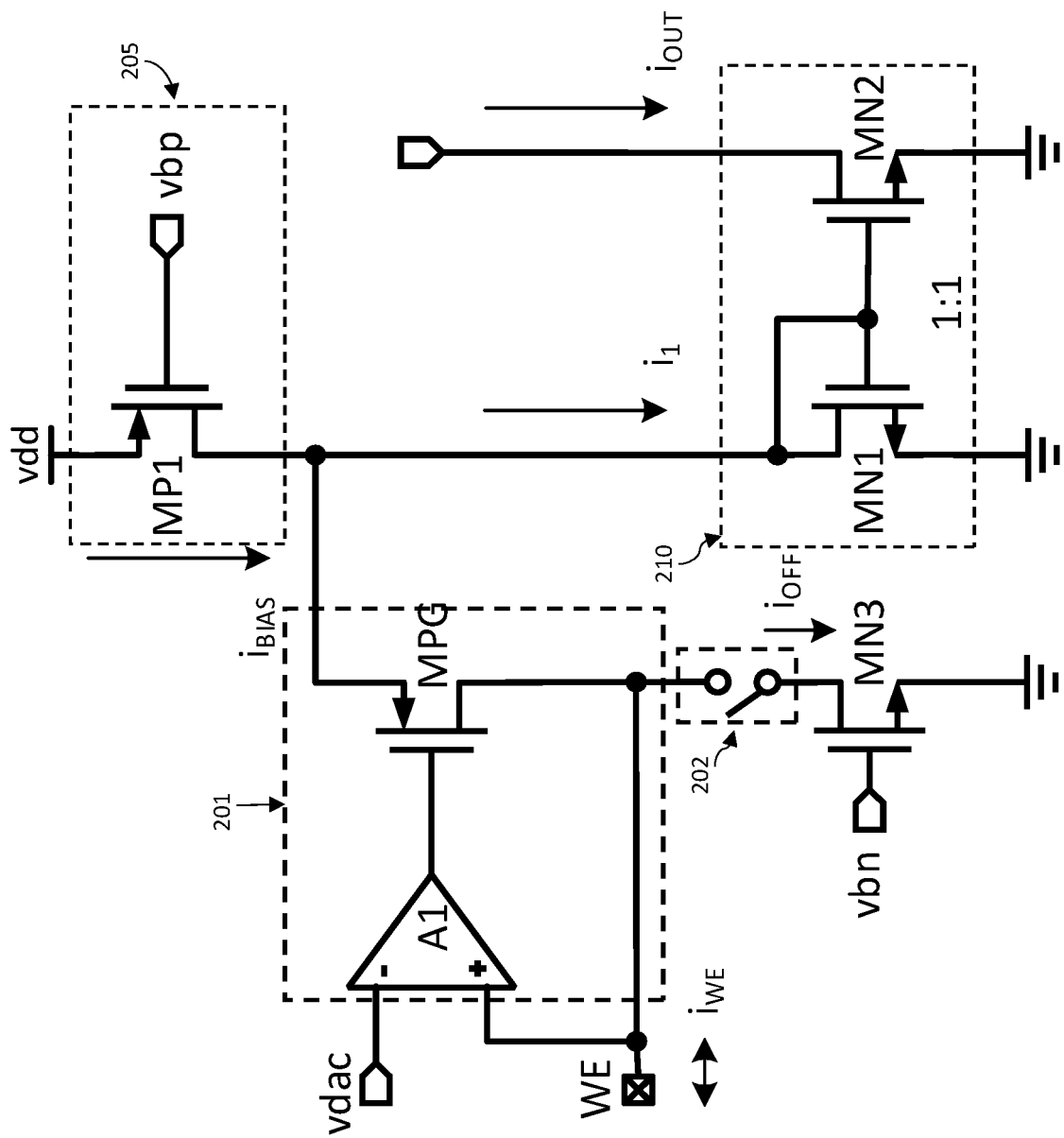
FIG. 2 schematically depicts a potentiostat according to a first implementation of the present disclosure.

FIG. 2 schematically illustrates a potentiostat according to a first implementation of the present disclosure. As shown, the disclosed potentiostat includes a p-type MOSFET (PMOS), MP1, operating as a bias current source 205 feeding an output-current mirror (i.e., an $i_1$-current mirror) 210 that includes n-type MOSFETs (NMOS), MN1 and MN2. The current level of the MP1 bias current source ($i_{BIAS}$) is controlled by an applied voltage (vbp). Accordingly, the maximum WE voltage (V(WE)$_{max}$) is no longer limited by the source-gate voltage of a diode connected transistor.

$$V(WE)_{max} = vdd - V_{SDsat_{MP1}} - V_{SD_{MPG}} \quad (2)$$

$VDS_{sat_{MP1}}$ is the source drain saturation voltage of MP1 transistor. The source-gate voltage of a diode connected transistor used in FIG. 1 is replaced with the much lower voltage across MP1, $VDS_{sat_{MP1}}$ in the first implementation of the present disclosure. Accordingly, the maximum applied voltage (vdac) to which the WE voltage can be set is increased and the range of WE voltages can be expanded when compared to a current-mirror potentiostat (FIG. 1). The voltage drop across the output current mirror 210 does not limit the range of possible work-electrode voltages.

The current-mirror potentiostat shown in FIG. 1 is limited to sense a work electrode current ($i_{WE}$) in one direction, a direction out of the WE (i.e., a sunk current on the WE). In some applications, it is desirable to measure a work-electrode current ($i_{WE}$) in a direction into the WE (i.e., a sourced current on the WE). The disclosed potentiostat allows for a work-electrode current in either the sunk or the source direction through the use of an offset current source ($i_{OFF}$) that can be turned ON or OFF (i.e., $i_{OFF}$=0). In some implementations, a switch device may be included, as shown in FIG. 2, to perform the ON/OFF function. In other words, the potentiostat implementation of FIG. 2 includes a feedback amplifier 201 configured to fix a voltage at the work electrode based on a set voltage vdac and to convey the work electrode current ($i_{WE}$). The potentiostat implementation of FIG. 2 further includes circuitry to generate an output current ($i_{OUT}$) that corresponds to (e.g., is dependent on, is related to) the work-electrode current ($i_{WE}$), where the generation does not limit a range of possible voltages at the work electrode.

In the potentiostat of FIG. 2, the output current ($i_{OUT}$) of the $i_1$-current mirror 210 (i.e., the current through MN2) is equal to a mathematical combination of the bias current, the work-electrode current, and the offset current. In particular, the output current is equal to the work-electrode current ($i_{WE}$) plus the offset current ($i_{OFF}$) subtracted from a bias current through MP1 (i.e., $i_{BIAS}$).

$$i_{OUT} = i_1 = i_{BIAS} - (\pm i_{WE} + i_{OFF}) \quad (3)$$

The output current ($i_{OUT}$) of the $i_1$-current mirror 210 is a function of the work electrode current ($i_{WE}$), the bias current of the MP1 transistor ($i_{BIAS}$) and the offset current ($i_{OFF}$).

The bias current ($i_{BIAS}$) and the offset current ($i_{OFF}$) of the implementation shown in FIG. 2 have different directions (i.e., the bias current ($i_{BIAS}$) is driven by a PMOS transistor MP1 whereas the offset current is driven by an NMOS transistor MN3). Accordingly, these currents may require matching over temperature (e.g., relative to a reference current—not shown) in order to achieve a highly accurate measurement of $i_{WE}$ over a range of temperatures (i.e., temperatures of the potentiostat).

Figure 3:
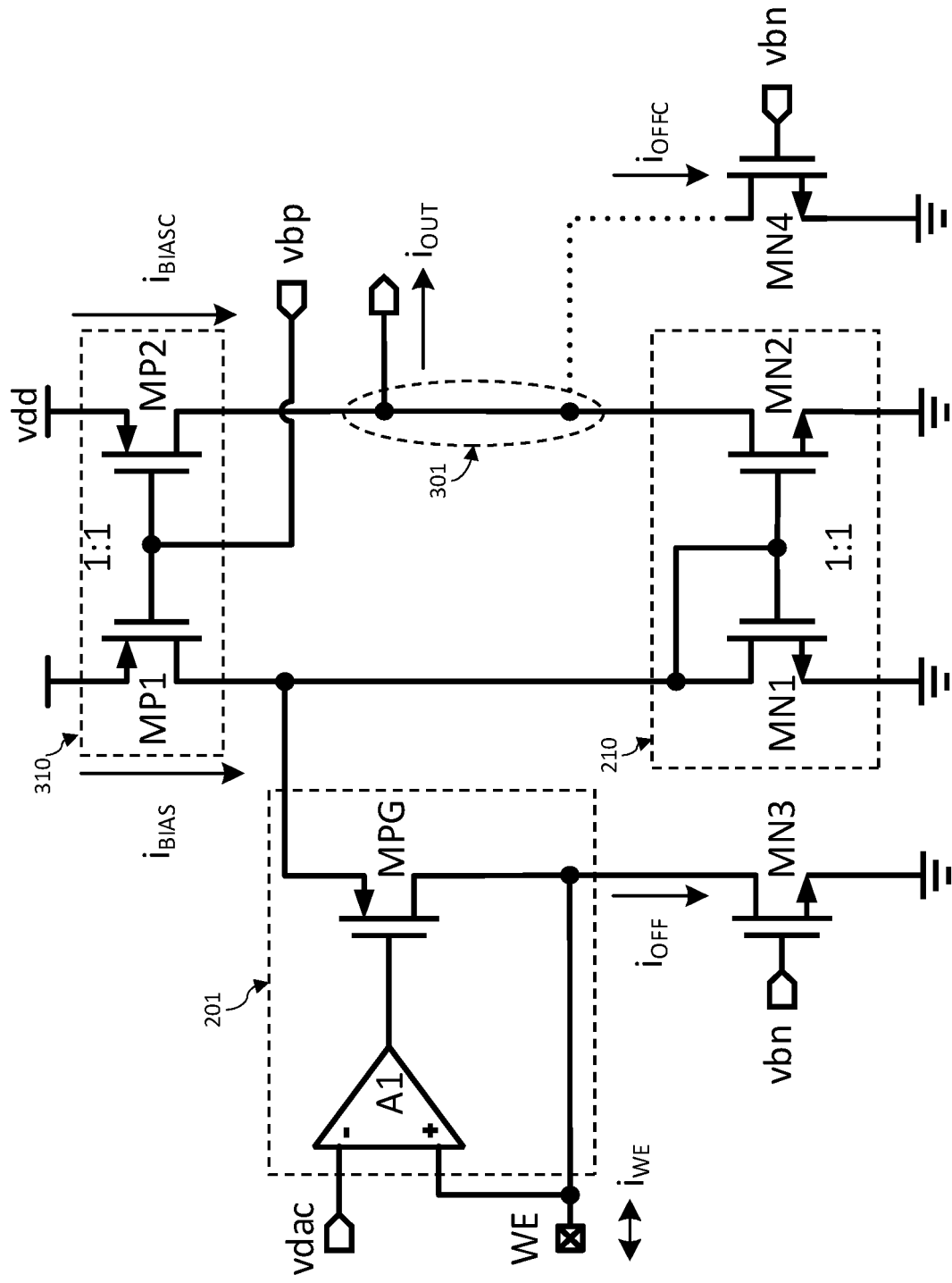
FIG. 3 schematically depicts a potentiostat according to a second implementation of the present disclosure.

FIG. 3 schematically illustrates a potentiostat according to a second implementation of the present disclosure. For this implementation of the potentiostat, the circuit of FIG. 2 is adapted so that the bias current component ($i_{BIAS}$), and optionally the offset current component ($i_{OFF}$), are effectively removed (i.e., cancelled) from the output current ($i_{OUT}$) at the output node 301. The removal is achieved by circuitry and devices added to the implementation shown in FIG. 2.

A PMOS transistor, MP2, that matches MP1, is added to generate a duplicate (i.e., a copy) of $i_{BIAS}$ (i.e., $i_{BIASC}$). Accordingly, the circuit formed by MP1 and MP2 can be referred to as an $i_{bias}$-current copier 310 (i.e., bias-current copier) because the current flowing through MP2 ($i_{BIASC}$) is a copy of the bias current ($i_{BIAS}$). The copy of the bias current enters the output node 301 thereby cancelling the component of the bias current from $i_{OUT}$. Accordingly, the output current $i_{OUT}$ shown in FIG. 3 may be described as:

$$i_{OUT} = i_{BIASC} - i_1 = \pm i_{WE} + i_{OFF}. \quad (4)$$

The current source for $i_{OFF}$ is embodied in the FIG. 3 implementation as an NMOS transistor, MN3 (i.e., offset-current source). MN3 is driven at its gate by a voltage (vbn). The offset current can be canceled from $i_{OUT}$ by adding a current source to the output node that matches the current source for $i_{OFF}$. Accordingly, an NMOS transistor MN4, which matches MN3, is driven at its gate by the same gate-voltage (vbn) to produce a current ($i_{OFFC}$) that is a copy (i.e., duplicate) of the offset current ($i_{OFF}$). The copy of the offset current leaves the output node 301 to cancel $i_{OFF}$ from $i_{OUT}$, leaving:

$$i_{OUT} = i_{BIASC} - i_1 - i_{OFFC} = \pm i_{WE}. \quad (5)$$

Equation 5 supposes that $i_{BIASC}$ matches perfectly $i_{BIAS}$ and that $i_{OFFC}$ matches perfectly $I_{OFF}$.

The output current $i_{OUT}$ is fed to a current-to-digital converter (not shown) that holds the output node 301 to a predefined voltage. The current-to-digital converter could be (but not limited to) a dual slope current-mode analog-to-digital converter, a transimpedance amplifier followed by an analog-to-digital converter.

Figure 4:
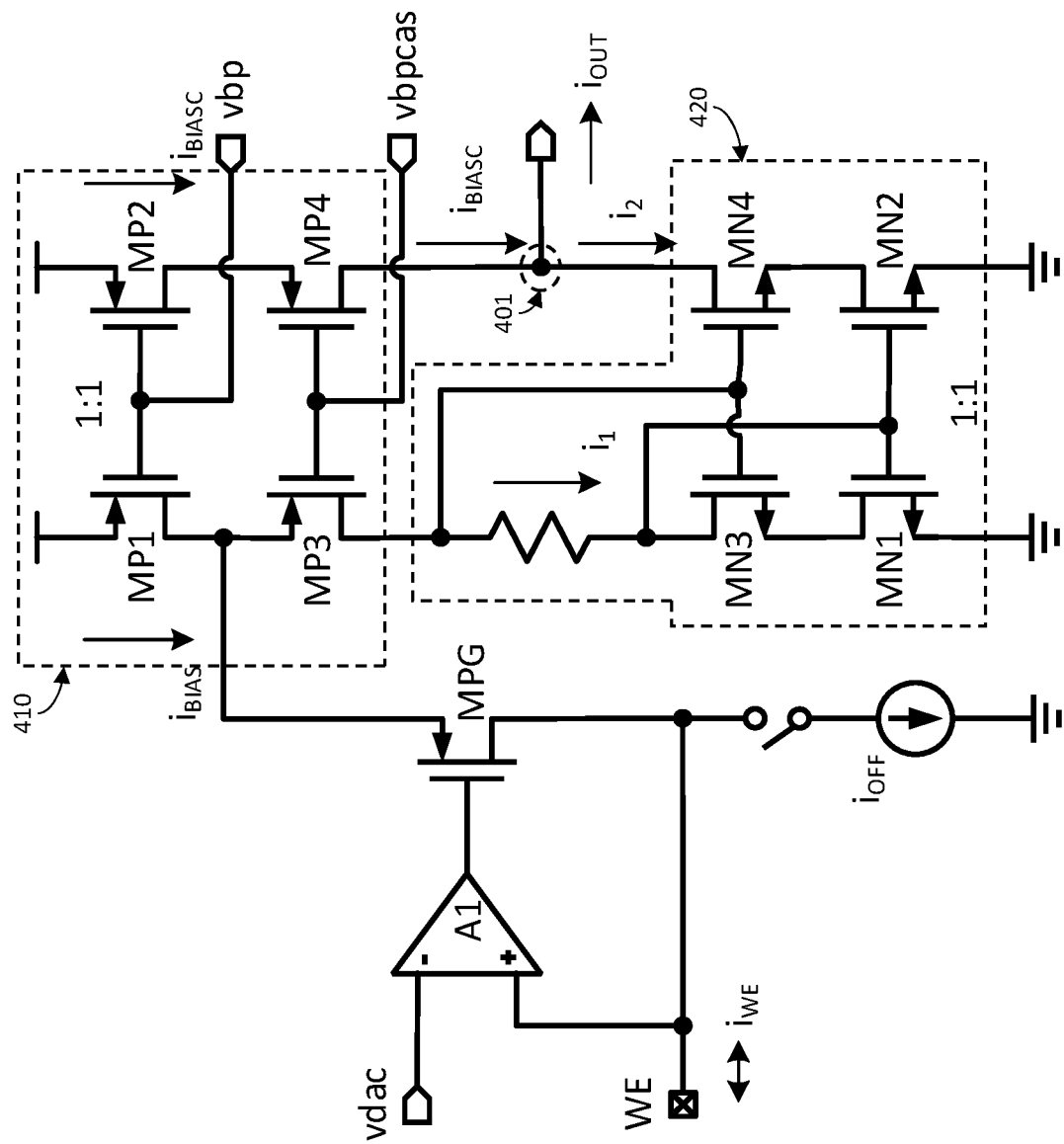
FIG. 4 schematically depicts a potentiostat according to a third implementation of the present disclosure.

FIG. 4 schematically illustrates a potentiostat according to a third implementation of the present disclosure. For this implementation of the potentiostat, the circuit of FIG. 3 is adapted so that the $i_1$-current mirror 210 and the $i_{bias}$-current copier 310 are modified to form a cascode topology (i.e., are each in a cascode configuration).

An $i_{bias}$-cascode-current copier 410 is formed by transistors MP1, MP2, MP3 and MP4. The $i_1$-cascode-current mirror 420 is formed by transistors MN1, MN2, MN3, MN4 and the resistor R. The output current $i_{OUT}$ is fed to a current-to-digital converter (not shown) that holds the output node 401 to a predefined voltage. Compared with the circuit topologies of the implementation in FIG. 3, the cascode topologies may provide a better (e.g., more accurate) copies of the currents. Additionally, the cascode topologies may allow for better matching (e.g., device matching) performance. The improvements provided by the cascode topologies may reduce the variability of $i_{OUT}$ (at the output node 401) against power, temperature and process variations compared to the implementation of FIG. 3. If an even higher accuracy (e.g., $i_{OUT}$ have less than 0.3% variation) potentiostat is required then further adaptations to the implementation of FIG. 4 may be included.

Figure 5:
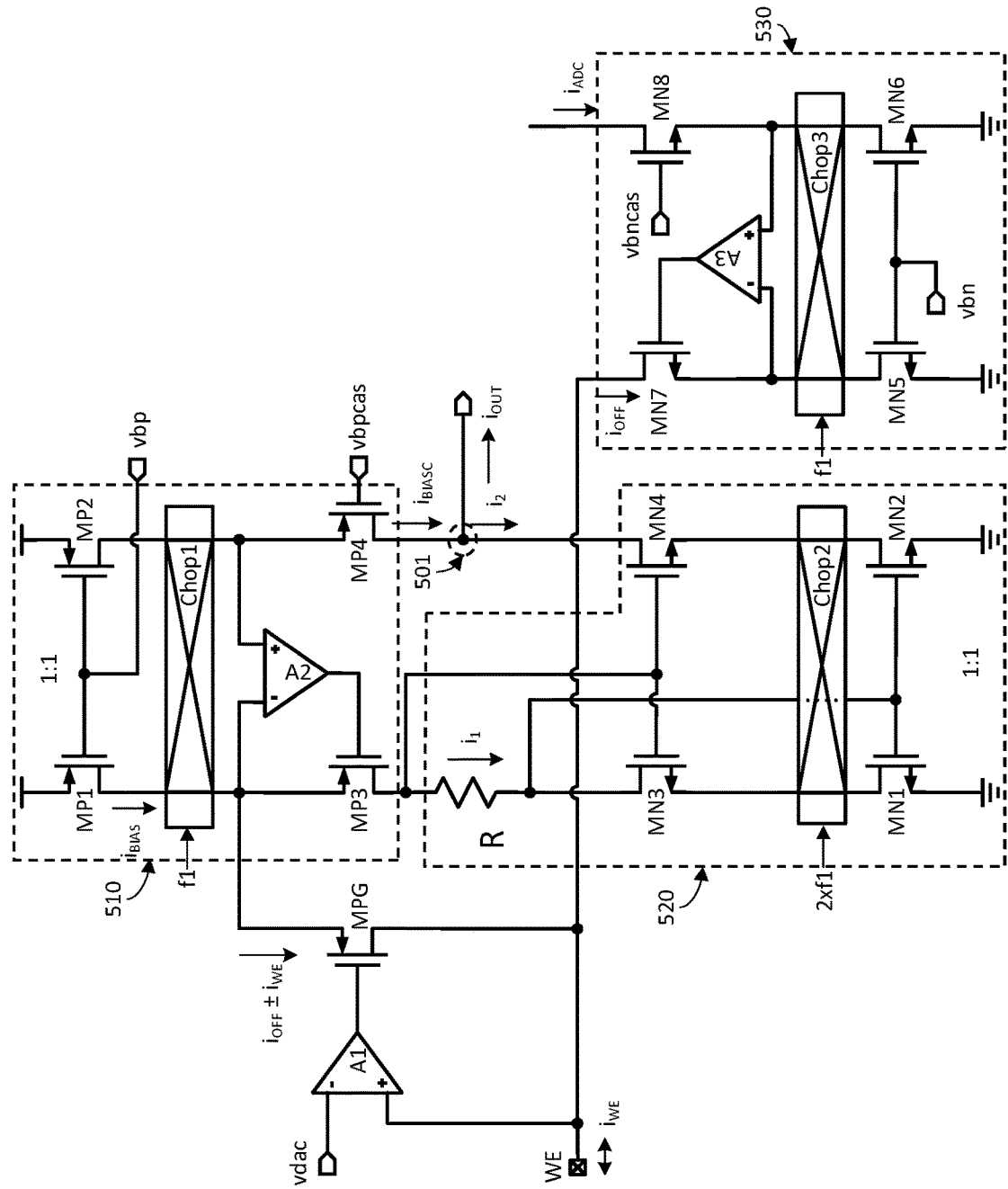
FIG. 5 schematically depicts a potentiostat according to a fourth implementation of the present disclosure.

FIG. 5 schematically illustrates a potentiostat according to a fourth implementation of the present disclosure. The implementation includes an $i_{bias}$-chopper-cascode-current copier 510 that includes a first chopper (i.e., Chop1) coupled between PMOS transistors MP1 and MP2 and PMOS transistors MP3 and MP4 of the cascode current mirror. The first chopper (Chop1) is configured by a clock signal (f1) to alternatively couple (i) the drain of MP1 to the source of MP3 and to the source of MP4 and (ii) the drain of MP2 to the source of MP4 and to the source of MP3. The first chopper (Chop1) is configured to reduce (e.g., eliminate) a mismatch (e.g., random mismatch) associated with the cascode current mirror configuration.

The $i_{bias}$-chopper-cascode-current copier 510 further includes a second amplifier (A2) coupled at an inverting input to a source terminal of MPG and a drain terminal of MP1 and coupled at a non-inverting input to a drain terminal of MP2. The amplifier (A2) is configured to maintain a voltage at the drain of MP1 equal to the voltage at drain of MP2 regardless of the value of the current flowing through the transistor MP3 ($i_1$). Thus, amplifier (A2) reduces the systematic mismatch (e.g., due to channel length modulation) of MP1 and MP2 by keeping their source to drain voltage equal. The $i_{bias}$-chopper-cascode-current copier 510 is configured to generate a copy of the bias current (i.e., a bias-cancel current $i_{BIASC}$) to cancel $i_{BIAS}$ at an output node 501. The output current $i_{OUT}$ is fed to a current-to-digital converter (not shown) that holds the output node 501 to a predefined voltage.

The potentiostat implementation of FIG. 5 further includes an $i_1$-chopper-cascode-current mirror 520, including a second chopper (Chop2) driven by a second clock signal that is twice the first clock signal (i.e., 2×f1). In some implementations, the potentiostat implementation of FIG. 5 can include an $i_1$-chopper-cascode-current mirror 520, including a second chopper (Chop2) driven by a second clock signal that is different than twice the first clock signal. In some implementations, the period of the signal clock (i.e., 1/f1) can be chosen equal to the half of the integration time of the current-to-digital converter following the potentiostat in order to reduce the glitches. In some implementations, the circuit shown in FIG. 5 can include an amplifier in the output current mirror 520. The second chopper is configured to improve the accuracy of the copy of $i_1$ (i.e., $i_2$) at the output node 501. In some implementations, the second chopper can reduce (e.g., eliminate) the mismatch in the output current mirror 520.

FIG. 5 includes an offset current source formed by MN5 and MN7 configured to generate $i_{OFF}$ and a current source formed by MN6 and MN8 configured to generate a reference current $i_{ADC}$ used for the digital conversion (i.e., $i_{OUT}$ is a multiple of $i_{ADC}$). The potentiostat implementation of FIG. 5 includes an $i_{off}$-chopper-cascode-current copier 530 (i.e., offset-current copier, offset-current copier circuit), driven by the first clock signal (f1). In some implementations, the $i_{off}$-chopper-cascode-current copier 530 can be driven by a frequency other than the first clock signal (f1). The $i_{off}$-chopper-cascode-current copier 530 includes a third amplifier (A3) configured to boost the output impedance of the offset current source (as $i_{OFF}$ is connected to the WE and the WE voltage may varies). The $i_{off}$-chopper-cascode-current copier 530 also includes a chopper (Chop3) configured to generate an offset current $i_{OFF}$ having a similar temp-coefficient as $i_{ADC}$ in order to minimize the temperature drift of the conversion. The use of choppers allows the use of small transistors without compromising matching performance.

Figure 6:
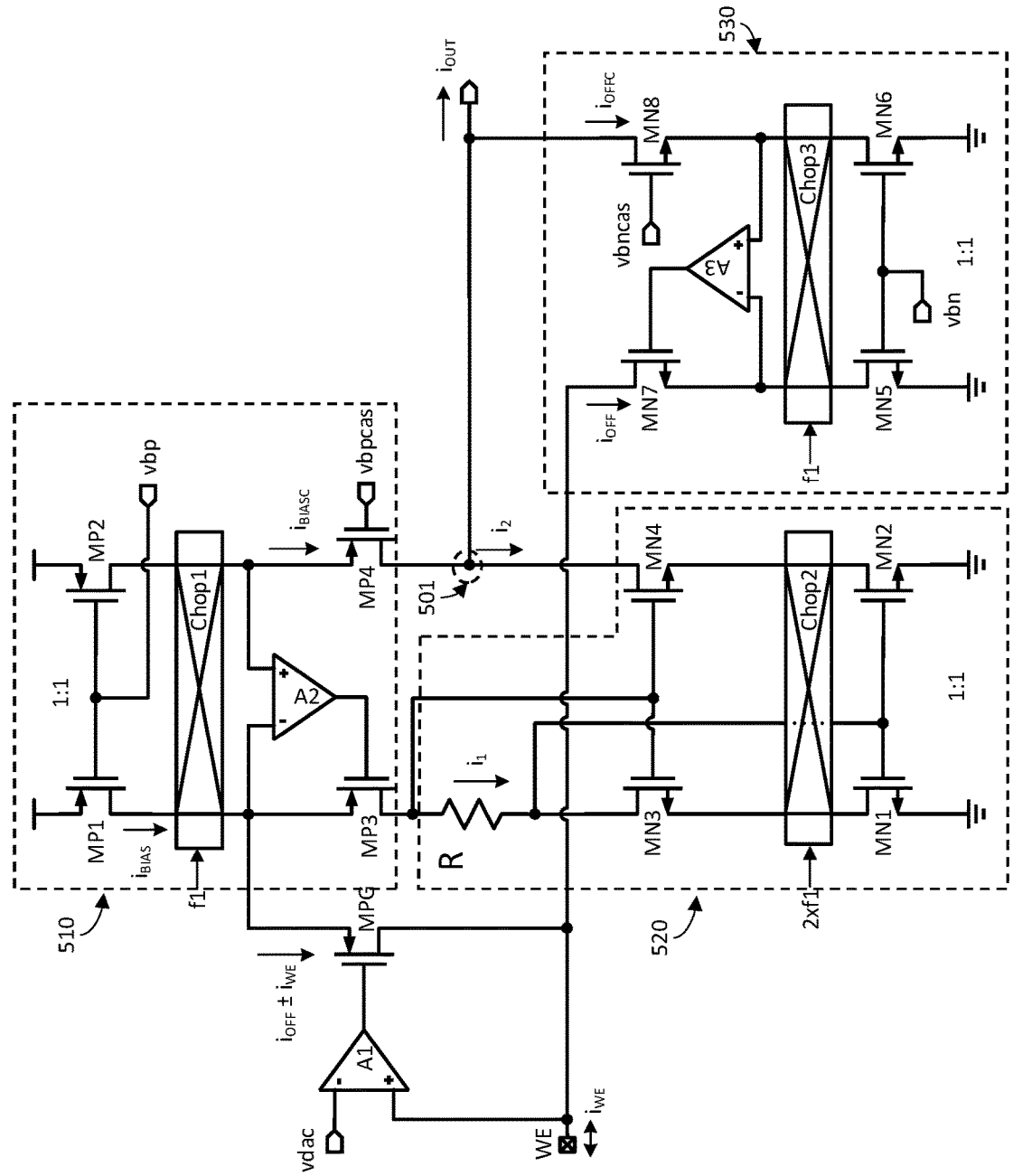
FIG. 6 schematically depicts a potentiostat according to a fifth implementation of the present disclosure.

FIG. 6 schematically illustrates a potentiostat according to a fifth implementation of the present disclosure. In this implementation, the $i_{OFF}$ and $i_{BIAS}$ are canceled so that the output current $i_{OUT}$ is a direct representation of the work electrode $i_{WE}$. This implementation includes matched transistors, MN5 and MN6 and MN7 and MN8 in the $i_{off}$-chopper-cascode-current copier 530 to generate a copy of $i_{OFF}$ (i.e., $i_{OFFC}$). Accordingly, the current $i_{OFF}$ can be canceled from the output node so that $i_{OUT}$ equals the work-electrode current ($i_{WE}$). The output current $i_{OUT}$ is fed to a current-to-digital converter (not shown) that holds the output node to a predefined voltage.

The example implementations presented herein are arranged according to an increasing accuracy and/or operating range. The first implementation, shown in FIG. 2, generally includes a circuit to increases a range of work-electrode voltages that the potentiostat can accommodate and to allow the potentiostat to handle a work-electrode current in either direction (i.e., bidirectional). The second implementation, shown in FIG. 3, adapts the first implementation to include a circuit (or circuits) to make the output current a more faithful representation of the work electrode current by eliminating the effect of the introduced bias current and (when included) the effect of the offset current. The third implementation, shown in FIG. 4, adapts the second implementation to include a cascode current mirror topology to make the output current less prone to variation resulting from process variations (i.e., process corners), power supply and temperature. The fourth implementation, shown in FIG. 5, adapts the third implementation to include a chopper circuits in the cascode current mirrors/current copiers to make the output current less prone to variations resulting from the process (random variations) and to eliminate the effect of the introduced bias current $i_{BIAS}$. Moreover, the fourth implementation includes amplifiers to boost the output impedance of the current sources. The fifth implementation, shown in FIG. 6, adapts the fourth implementation to include a circuit to eliminate the effect of the offset current $i_{OFF}$ in term of conversion temperature drift.

Variations to the implementations described may exists. By using one or more of the circuits described herein a potentiostat offering benefits (e.g., when compared to a traditional current mirror approach) may be implemented. The benefits may include the ability to set a large work-electrode voltage range (e.g., +/−100 mV from power and ground). The benefits may include the ability to measure bidirectional work-electrode currents. The benefits may include high accuracy (e.g., less than 0.3 percent) measurement of the work-electrode current. For example, work-electrode currents in a range of a few hundred pico-amperes (pA) to a few hundred nano-amperes (nA) may be accurately measured. The benefits may include measuring with high temperature stability (e.g., less than 0.3 percent variations). The benefits may include a small size potentiostat. For example, the use of choppers facilitates the use of physically small transistors in the current mirrors without compromising (i.e., reducing) matching (current copying) performance.

Figure 7:
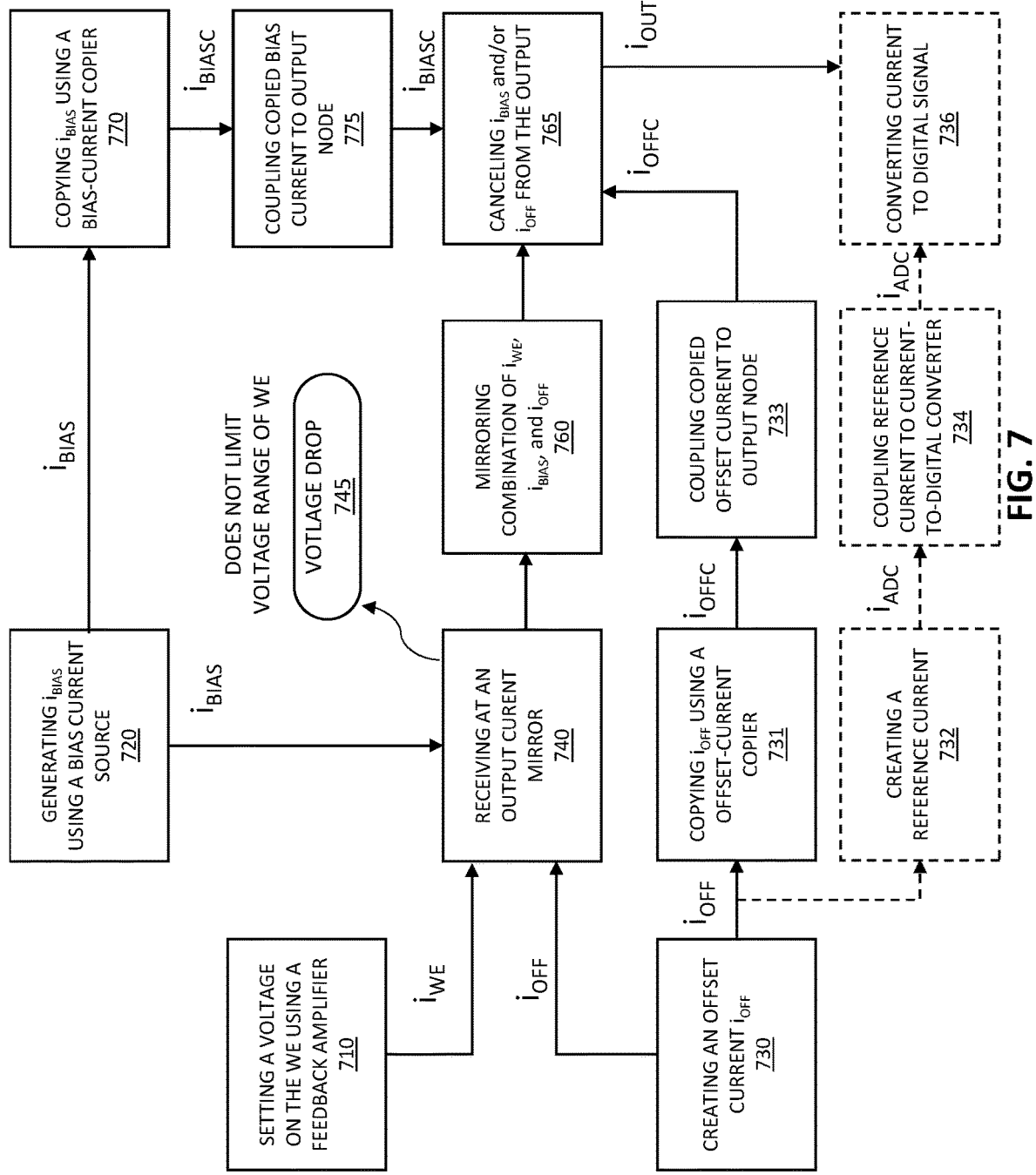
FIG. 7 is a flow chart of a possible implementation of a method for measuring a current from a work electrode without limiting a range of a possible work-electrode voltages.

A possible implementation of a method for measuring a current from a work electrode without limiting a range of possible work-electrode voltage (e.g., increasing a maximum possible work-electrode voltage) is illustrated in the flow chart shown in FIG. 7. The method includes setting 710 a voltage on the work electrode (i.e., a WE voltage) using a feedback amplifier (e.g., that includes an amplifier A1 and a transistor MPG). Additionally, the method includes generating 720 a bias current ($i_{BIAS}$) using a bias current source. The bias current source can be a transistor (e.g., bias current source 205 as shown in FIG. 2). Moreover, the method includes creating 730 an offset current ($i_{OFF}$) to facilitate measuring a bidirectional work electrode current ($i_{WE}$). The method also includes receiving 740 a mathematical combination of the bias current, the work electrode current, and the offset current (e.g., $i_{BIAS} \pm i_{WE} - i_{OFF}$) at an input of an output current mirror. The output current mirror can be (but is not limited to) a current mirror 210 as shown in FIGS. 2 and 3, a cascode current mirror 420 as shown in FIG. 4, or a boosted cascode current mirror with a chopper (Chop2) 520 as shown in FIGS. 5 and 6. The method further includes mirroring 760 (i.e., duplicating) the mathematical combination of the bias current, the work electrode current, and the offset current to an output node. Additionally, the method includes copying 770 the bias current using a bias current copier circuit (i.e., bias current copier) and coupling 775 the copied bias current ($i_{BIASC}$) to the output node. Additionally, the method includes copying 731 the offset current using an offset current copier circuit (i.e., offset current copier) and coupling 733 the copied offset current ($i_{OFFC}$) to the output node. The bias copied bias current ($i_{BIASC}$) and the copied offset current ($i_{OFFC}$) cancel 765 (i.e., cancel the effects of) the bias current ($i_{BIAS}$) and the offset current ($i_{OFF}$) from the output current ($i_{OUT}$).

In a possible implementation, the method includes an output current mirror having a voltage drop 745 across the output current mirror does not limit a range of possible voltages on the work electrode (i.e., does not limit the work electrode voltage).

In other possible implementations, the copy of the bias current may be created (i.e., generated) by a $i_{bias}$-current copier 310 (e.g., as shown in FIG. 3), a ibias-cascode-current copier 410 (e.g., as shown in FIG. 4), or a ibias-chopper-cascode-current copier 510 including a chopper (Chop1) and an amplifier (A2) (e.g., as shown in FIGS. 5 and 6). Similarly, the copy of the offset current ($i_{OFFC}$) may be created by an $i_{off}$-chopper-cascode-current copier 530 (e.g., as in FIG. 6).

In another possible implementation, the offset current may be used (e.g., also used) to create a reference for a digital conversion of the output current ($i_{OUT}$). In the implementation, the offset current ($i_{OFF}$) may be used to create 732 a reference current ($i_{ADC}$) using an $i_{off}$-chopper-cascode-current copier 530 (e.g., as in FIG. 5). In this case, the reference current ($i_{ADC}$) may be coupled 734 to a current-to-digital converter as a reference level for the output current $i_{OUT}$. For example, a current-to-digital converter (not shown) may receive the output current $i_{OUT}$ and the copy of the offset current ($i_{ADC}$) created by an $i_{off}$-chopper-cascode-current copier 530, as shown in FIG. 5. The current-to-digital converter may be configured to convert 736 $i_{OUT}$ to a digital signal using the reference current ($i_{ADC}$) as a reference level for digital conversion. In this case, there may be no $i_{OFFC}$ in the output current at the output node. Accordingly, in these implementations only $i_{BIAS}$ is canceled from the output current at the output node (i.e., from the output).

The technology of the present disclosure may be implemented as an electro-chemical measurement system (i.e., system). The system includes an electrochemical cell having a work electrode. The system also includes a potentiostat that is configured to maintain a work-electrode voltage of the work electrode and is further configured to measure a work-electrode current at the work-electrode. The potentiostat includes an output-current mirror that is configured to duplicate a current corresponding to the work-electrode current as an output current at an output node (i.e., of the potentiostat). The potentiostat also includes a bias-current source coupled to the output-current mirror.

In one possible implementation the bias-current source is configured to provide a bias current to a transistor (e.g., a diode-connected transistor) in the output-current mirror that has a voltage corresponding to a strong inversion condition. The bias current source and the output current mirror are arranged so that the voltage corresponding to the strong-inversion condition does not limit a range of possible work-electrode voltages. Further, in this arrangement (i.e., topology) an upper voltage of a range of possible work electrode voltages is approximately a supply voltage of the potentiostat.

The bias current source is coupled between a voltage source (i.e. a supply voltage) and the feedback amplifier and is configured to output a bias current. The bias current source has a voltage drop that is lower (e.g., much lower) than a voltage (e.g., a required voltage) for a current mirror coupled to the work electrode (e.g., connected on a path of the work electrode), such as shown in FIG. 1.

In another possible implementing the output-current mirror can be in a cascode configuration to reduce a mismatch (e.g., a mismatch between transistors) in the output-current mirror. The reduction of the mismatch can facilitate the use of smaller transistors, thereby allowing a size of the potentiostat to be reduced (e.g., the potentiostat with an output-current mirror in a cascode configuration may be physically smaller than without the cascode configuration).

In the specification and/or figures, typical implementations have been disclosed. The present disclosure is not limited to such exemplary implementations. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

It will be understood that, in the foregoing description, when an element, such as a component is referred to as being connected to, electrically connected to, coupled to, or electrically coupled to another element, it may be directly connected or coupled to the other element, or one or more intervening elements may be present. In contrast, when an element is referred to as being directly connected to or directly coupled to another element, there are no intervening elements present. Although the terms directly connected to or directly coupled to may not be used throughout the detailed description, elements that are shown as being directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. A potentiostat circuit comprising:
   a feedback amplifier coupled to a work electrode, the feedback amplifier configured to set or to maintain a voltage on the work electrode and to output a current corresponding to a work-electrode current flowing to or from the work electrode;
   a bias current source coupled between a voltage source and the feedback amplifier and configured to output a bias current, the bias current source having a voltage drop that partially determines an upper limit of a range of possible work-electrode voltages; and
   an output current mirror coupled to the feedback amplifier and the bias current source, the output current mirror configured to mirror a mathematical combination of the bias current and the work-electrode current as an output current at an output node, wherein a voltage drop across the output current mirror does not limit the range of possible work-electrode voltages.

2. The potentiostat circuit according to claim 1, wherein the bias current source is a transistor.

3. The potentiostat circuit according to claim 2, wherein the bias current source is a current copier in a cascode configuration.

4. The potentiostat circuit according to claim 3, wherein the current copier in a cascode configuration includes a chopper and an amplifier.

5. The potentiostat circuit according to claim 3, wherein the current copier is coupled to the output node and is configured to cancel the bias current from the output current.

6. The potentiostat circuit according to claim 1, wherein the feedback amplifier includes an offset-current source configured to conduct an offset current when the work electrode current flows out of the work electrode and wherein the output current includes the offset current.

7. The potentiostat circuit according to claim 6, wherein the offset-current source is a first transistor coupled to the work electrode and configured to conduct the offset current.

8. The potentiostat circuit according to claim 7, further including a second transistor coupled to the output node that is configured to cancel the offset current from the output current.

9. The potentiostat circuit according to claim 6 wherein the offset-current source is duplicated using an offset-current copier coupled to the work electrode and the output node or to a current-to-digital converter.

10. The potentiostat circuit according to claim 9, wherein the offset-current copier is configured to generate a reference current for the current-to-digital converter.

11. The potentiostat circuit according to claim 9, wherein the offset-current copier is configured to create a current to cancel the offset current at the output node.

12. The potentiostat circuit according to claim 9, wherein the offset-current copier is in a cascode configuration.

13. The potentiostat circuit according to claim 12, wherein the offset-current copier in the cascode configuration includes a chopper and an amplifier.

14. The potentiostat circuit according to claim 1, wherein the output current mirror is in a cascode configuration.

15. The potentiostat circuit according to claim 14, wherein the output current mirror in a cascode configuration includes a chopper and an amplifier.

16. A method for measuring a work-electrode current without limiting a range of possible work-electrode voltages, the method comprising:
  receiving, at an output current mirror, a mathematical combination of a work electrode current, a bias current, and an offset current;
  mirroring, using an output current mirror, the mathematical combination of the work electrode current, the bias current, and the offset current as an output current at an output node;
  creating a copy of the bias current using a bias-current copier circuit;
  creating a copy of the offset current using an offset-current copier circuit;
  coupling the copy of the bias current and the copy of the offset current to the output node;
  canceling, using the copy of the bias current and the copy of the offset current, the bias current and the offset current from output current, wherein a voltage drop across the output current mirror does not limit the range of possible work-electrode voltages.

17. The method according to claim 16, wherein:
the bias-current copier circuit includes a chopper and is in a cascode configuration; and
the offset-current copier circuit includes a chopper and is in a cascode configuration.

18. An electro-chemical measurement system comprising:
an electrochemical cell including a work electrode; and
a potentiostat configured to maintain a work-electrode voltage on the work electrode and further configured to measure a work-electrode current at the work electrode, the potentiostat including:
  an output-current mirror configured to duplicate a current corresponding to the work-electrode current as an output current at an output node; and
  a bias current source coupled between a voltage source and a feedback amplifier configured to output a bias current, the bias current source having a voltage drop that is lower than a voltage for a current mirror coupled to the work electrode.

19. The electro-chemical measurement system according to claim 18, wherein:
the output-current mirror is in a cascode configuration and includes a chopper and an amplifier to reduce a mismatch in the output-current mirror.

20. The electro-chemical measurement system according to claim 19, wherein:
the reduced mismatch corresponds to a reduction of a size of the potentiostat.

* * * * *